US008855949B2

(12) United States Patent  
Nonomura

(10) Patent No.: US 8,855,949 B2  
(45) Date of Patent: Oct. 7, 2014

(54) PLASMA PROCESSING DEVICE AND METHOD OF MONITORING DISCHARGE STATE IN PLASMA PROCESSING DEVICE

(75) Inventor: Masaru Nonomura, Fukuoka (JP)

(73) Assignee: Panasonic Corporation, Osaka (JP)

( * ) Notice: Subject to any disclaimer, the term of this patent is extended or adjusted under 35 U.S.C. 154(b) by 772 days.

(21) Appl. No.: 13/001,810

(22) PCT Filed: Jun. 29, 2009

(86) PCT No.: PCT/JP2009/003000  
§ 371 (c)(1),  
(2), (4) Date: Dec. 29, 2010

(87) PCT Pub. No.: WO2010/001583  
PCT Pub. Date: Jan. 7, 2010

(65) Prior Publication Data  
US 2011/0109530 A1 May 12, 2011

(30) Foreign Application Priority Data  
Jul. 2, 2008 (JP) ................ P2008-172974

(51) Int. Cl.  
*G01R 15/00* (2006.01)  
*H01J 37/32* (2006.01)

(52) U.S. Cl.  
CPC ... *H01J 37/32935* (2013.01); *H01J 2237/0206* (2013.01)  
USPC ......... 702/57; 219/121.36; 438/513

(58) Field of Classification Search  
CPC ............... H01J 2237/0206; H05H 2001/3494; H05H 7/14  
USPC .......................................... 702/57  
See application file for complete search history.

(56) References Cited

U.S. PATENT DOCUMENTS

| 5,611,899 A | 3/1997 | Maass |
| 2005/0194094 A1 | 9/2005 | Yasaka |

(Continued)

FOREIGN PATENT DOCUMENTS

| JP | 02-026023 A | 1/1990 |
| JP | 08-167500 A | 6/1996 |

(Continued)

OTHER PUBLICATIONS

Definition of "Detector", http://www.merriam-webster.com/dictionary/detector, last accessed Oct. 31, 2013.*

(Continued)

*Primary Examiner* — John Breene  
*Assistant Examiner* — Timothy H Hwang  
(74) *Attorney, Agent, or Firm* — Pearne & Gordon LLP

(57) ABSTRACT

An object is to provide a plasma processing device capable of properly monitoring a state of plasma discharge and detecting a precursor to abnormal discharge, and a method of monitoring the state of discharge in the plasma processing device. In analysis processing for monitoring executed by detecting, by a signal analyzing portion 30, a signal of a potential change induced in a discharge detection sensor 23 in response to a change in plasma discharge of the inside of a processing chamber and recorded in a signal recorder 20, based on a counter value N3 obtained by detecting a signal of abnormal discharge (first arc discharge) generated between an electrode portion and an object to be processed by a first detector 33 and a counter value N4 obtained by detecting a signal of micro-arc discharge (second arc discharge) generated by deposition of a foreign substance in the processing chamber by a second detector 35, an abnormal discharge determining portion 39 calculates a difference (N3−N4) and compares the difference (N3−N4) with a threshold value a2 for determination and determines whether there is a possibility of generation of abnormal discharge in the processing chamber.

2 Claims, 9 Drawing Sheets

(56) References Cited

U.S. PATENT DOCUMENTS

| | | |
|---|---|---|
| 2005/0212450 A1 | 9/2005 | Martinez et al. |
| 2006/0049831 A1* | 3/2006 | Anwar et al. .................. 324/536 |
| 2006/0081564 A1* | 4/2006 | Moroz et al. ............. 219/121.43 |
| 2007/0058322 A1 | 3/2007 | Ito et al. |
| 2007/0121267 A1 | 5/2007 | Kotani et al. |
| 2010/0163182 A1 | 7/2010 | Mizukami et al. |

FOREIGN PATENT DOCUMENTS

| | | |
|---|---|---|
| JP | 8-225935 A | 9/1996 |
| JP | 11-233293 A | 8/1999 |
| JP | 2001-319922 A | 11/2001 |
| JP | 2002-176034 A | 6/2002 |
| JP | 2003-318115 A | 11/2003 |
| JP | 2003318115 A * | 11/2003 |
| JP | 2004-225100 A | 8/2004 |
| JP | 2005-268214 A | 9/2005 |
| JP | 2006-140440 A | 6/2006 |
| JP | 2007-073309 A | 3/2007 |
| JP | 2007-115860 A | 5/2007 |
| JP | 2007-149596 A | 6/2007 |
| JP | 2007-149597 A | 6/2007 |
| JP | 2009-48880 A | 3/2009 |
| WO | 2005/057993 A1 | 6/2005 |

OTHER PUBLICATIONS

International Search Report for PCT/JP2009/003000, (Sep. 15, 2009).

* cited by examiner

PLASMA PROCESSING DEVICE AND METHOD OF MONITORING DISCHARGE STATE IN PLASMA PROCESSING DEVICE

TECHNICAL FIELD

The present invention relates to a plasma processing device for executing plasma processing for an object to be processed such as a board, and a method of monitoring a discharge state in the plasma processing device.

BACKGROUND ART

Plasma processing is known as a surface processing method such as etching or cleaning of an object to be processed such as a board on which electronic parts are mounted. In the plasma processing, predetermined surface processing is executed by placing a board as an object to be processed in a vacuum chamber which forms a processing chamber, generating plasma discharge in the processing chamber, and allowing resultant ions or electrons to act on a surface of the board. In order to stably execute the plasma processing with good processing quality, plasma discharge has to be exactly generated according to a discharge condition preset in line with a processing purpose. Consequently, various means and methods are conventionally used for the purpose of monitoring a state of generating the plasma discharge (see Patent Documents 1 to 4).

In Patent Document 1, generation of abnormal discharge and a generation position are identified by imaging the inside of a reaction room by a camera and detecting light emission by the abnormal discharge. In Patent Document 2, pulse-shaped voltage variations appearing in an output terminal of an impedance matching device used in a plasma processing device are recognized as an abnormal discharge phenomenon generation signal in plasma. In Patent Document 3, an abnormal discharge region having a possibility of generating abnormal discharge is predicted and set with respect to parameters constructing a plasma processing condition, that is, an applied high frequency output, a distance between electrodes or a pressure of the inside of a processing chamber and it is automatically determined whether or not to be the abnormal discharge region at the time of executing processing or the time of setting a condition based on setting data. In Patent Document 4, a foretaste of generation of abnormal discharge is grasped by detecting variations in ESC leakage current for electrostatic adsorption in a plasma processing device of a configuration of holding a processed body by electrostatic adsorption.

RELATED ART DOCUMENTS

Patent Documents

Patent Document 1: JP-A-2001-319922
Patent Document 2: JP-A-2002-176034
Patent Document 3: JP-A-11-233293
Patent Document 4: JP-A-2007-73309

DISCLOSURE OF THE INVENTION

Problem to be Solved by the Invention

However, the related art shown in each of the Patent Documents described above respectively had the following drawbacks. First, the related art shown in Patent Document 1 detects that abnormal discharge is generated inside a reaction room, and cannot be applied to a use in which previous prediction of generation of abnormal discharge is desired. Also, in Patent Document 2, pulse-shaped voltage variations appearing in an output terminal of an impedance matching device are only used as a substitute index of generation of abnormal discharge and actual abnormal discharge cannot be necessarily predicted exactly. Also, in Patent Document 3, an abnormal discharge region set by combination of each of the parameters tends to be set in the safe side, so that it is difficult to avoid a situation eliminated as the abnormal discharge region though abnormal discharge is not generated actually.

Further, in Patent Document 4, detection of variations in ESC leakage current are used as a principle of abnormal discharge detection, so that there is a problem that it cannot be applied to a plasma processing device without using electrostatic adsorption and an applicable object is limited. Thus, the conventional plasma processing devices had a problem of being difficult to properly monitor a state of plasma discharge and detect a foretaste of abnormal discharge.

An object of the invention is to provide a plasma processing device capable of properly monitoring a plasma discharge state and detecting a foretaste of abnormal discharge, and a method of monitoring a state of discharge in the plasma processing device.

Means for Solving the Problem

According to the invention, a plasma processing device including: a vacuum chamber that forms a processing chamber; an electrode portion arranged in the processing chamber and electrically isolated from the vacuum chamber; an vacuum exhaust portion configured to exhaust a gas from the processing chamber by vacuum; a gas supply portion configured to supply a gas which is used for plasma generation into the processing chamber; a high frequency power supply portion configured to generate plasma discharge in the processing chamber when a high frequency voltage is impressed upon the electrode portion; a matching device configured to match an impedance of a plasma discharge circuit configured to generate the plasma discharge with an impedance of the high frequency power supply portion; a discharge detection sensor including, at least, a plate-shaped dielectric member arranged such that one surface thereof opposes plasma discharge generated in the processing chamber, and a probe electrode arranged on the other surface of the dielectric member; and a signal analyzing portion configured to detect a signal of a potential change induced in the probe electrode in response to a change in the plasma discharge and execute analysis processing for monitoring a state of discharge. The plasma processing device is configured to execute plasma processing for an object to be processed which is placed on the electrode portion to plasma processing. The signal analyzing portion includes: a first detector configured to detect a signal of a potential change induced by first arc discharge generated between the electrode portion and the object to be processed; a second detector configured to detect a signal of a potential change induced by second arc discharge other than the first arc discharge; and an abnormal discharge determining portion configured to obtain a difference between a number of detections by the first detector and a number of detections by the second detector within predetermined time and to determine whether there is a possibility of generation of abnormal discharge in the processing chamber based on the difference.

In a method of monitoring a state of discharge in a plasma processing device of the invention, the plasma processing device includes: a vacuum chamber that forms a processing chamber; an electrode portion arranged in the processing chamber and electrically isolated from the vacuum chamber; an vacuum exhaust portion configured to exhaust a gas from the processing chamber by vacuum; a gas supply portion configured to supply a gas which is used for plasma generation into the processing chamber; a high frequency power supply portion configured to generate plasma discharge in the processing chamber when a high frequency voltage is impressed onto the electrode portion; a matching device configured to match an impedance of a plasma discharge circuit configured to generate the plasma discharge with an impedance of the high frequency power supply portion; and a discharge detection sensor including, at least, a plate-shaped dielectric member attached to the vacuum chamber such that one surface thereof opposes plasma discharge generated in the processing chamber, and a probe electrode arranged on the other surface of the dielectric member. The plasma processing device monitors the state of the plasma discharge in the processing chamber. The method includes: a signal recording step of receiving a signal of a potential change induced in the probe electrode in response to a change in the plasma discharge, and temporarily storing the signal as signal data indicating the potential change, and a signal analysis step of executing analysis processing for monitoring a state of the plasma discharge with reference to the temporarily stored signal data. The signal analysis step includes: detecting, by a first detector, a signal of a potential change induced by first arc discharge generated between the electrode portion and an object to be processed; detecting, by a second detector, a signal of a potential change induced by second arc discharge other than the first arc discharge; obtaining a difference between a number of detections by the first detector and a number of detections by the second detector within predetermined time; and determining whether there is a possibility of generation of abnormal discharge, based on the difference.

Advantages of the Invention

According to the invention, a state of plasma discharge can properly be monitored to detect a foretaste of abnormal discharge by using a method of obtaining a difference between the number of detections in which a signal of a potential change induced by first arc discharge generated between an electrode portion and an object to be processed is detected by a first detector and the number of detections in which a signal of a potential change induced by second arc discharge other than the first arc discharge is detected by a second detector within predetermined time and determining the presence or absence of possibility of generation of abnormal discharge inside a processing chamber based on this difference as analysis processing for monitoring a state of discharge which is executed by detecting a signal of a potential change induced according to a change in plasma discharge.

MODE FOR CARRYING OUT THE INVENTION

Figure 1:
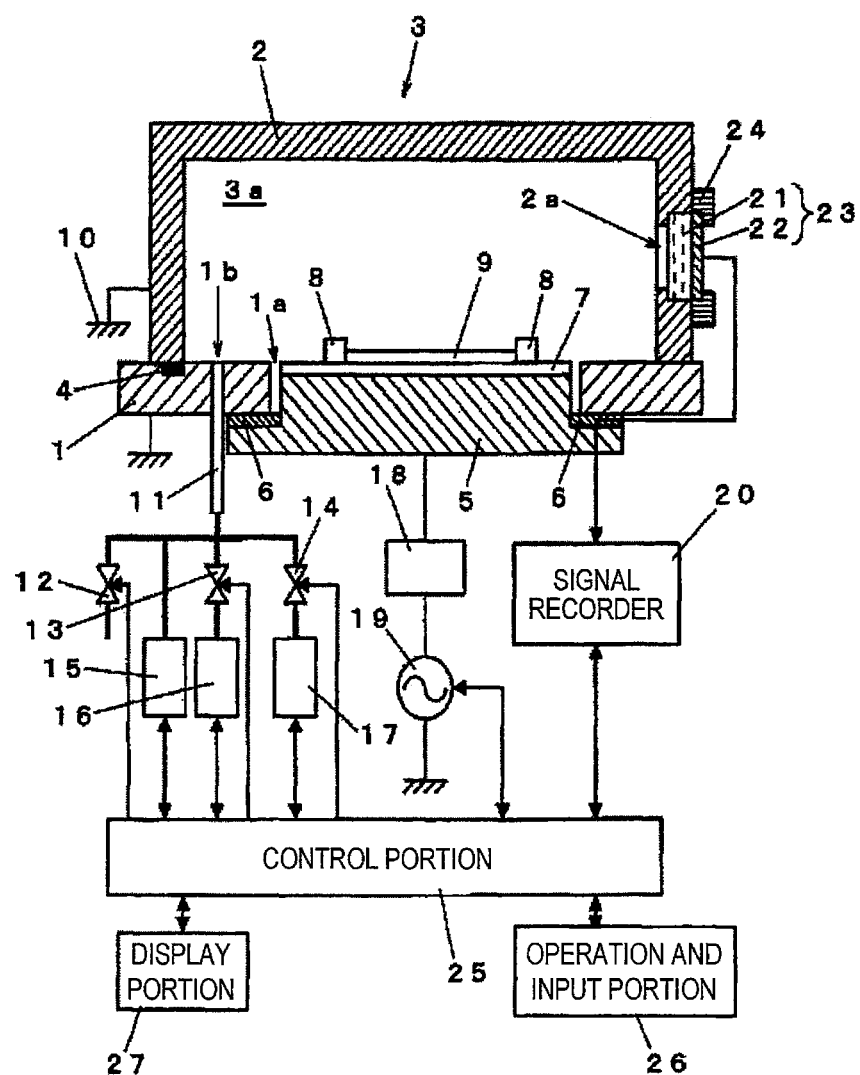
FIG. 1 is a sectional diagram of a plasma processing device of one embodiment of the invention.
Figure 2:
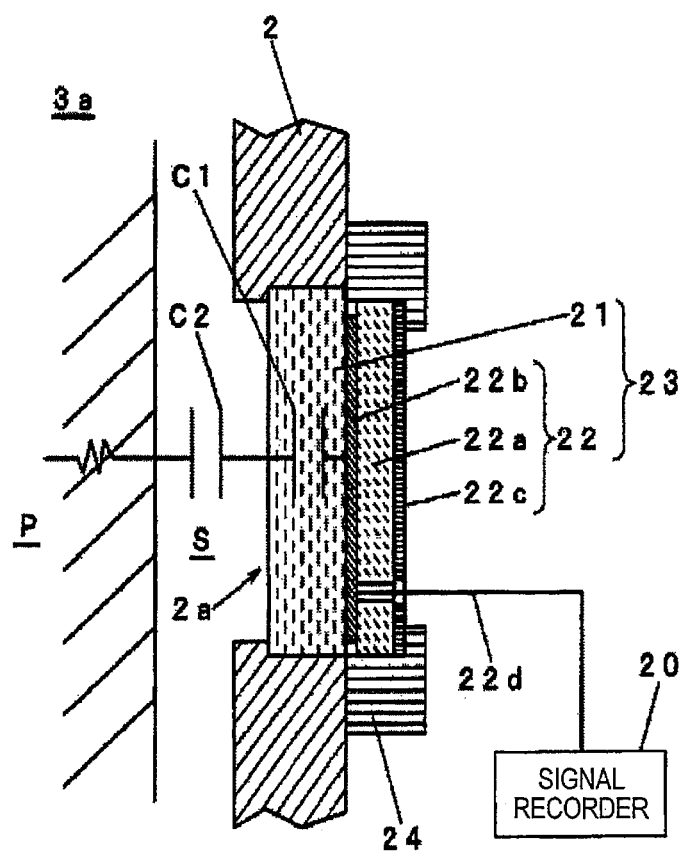
FIG. 2 is a configuration explanatory diagram of a discharge detection sensor used in the plasma processing device of one embodiment of the invention.
Figure 3:
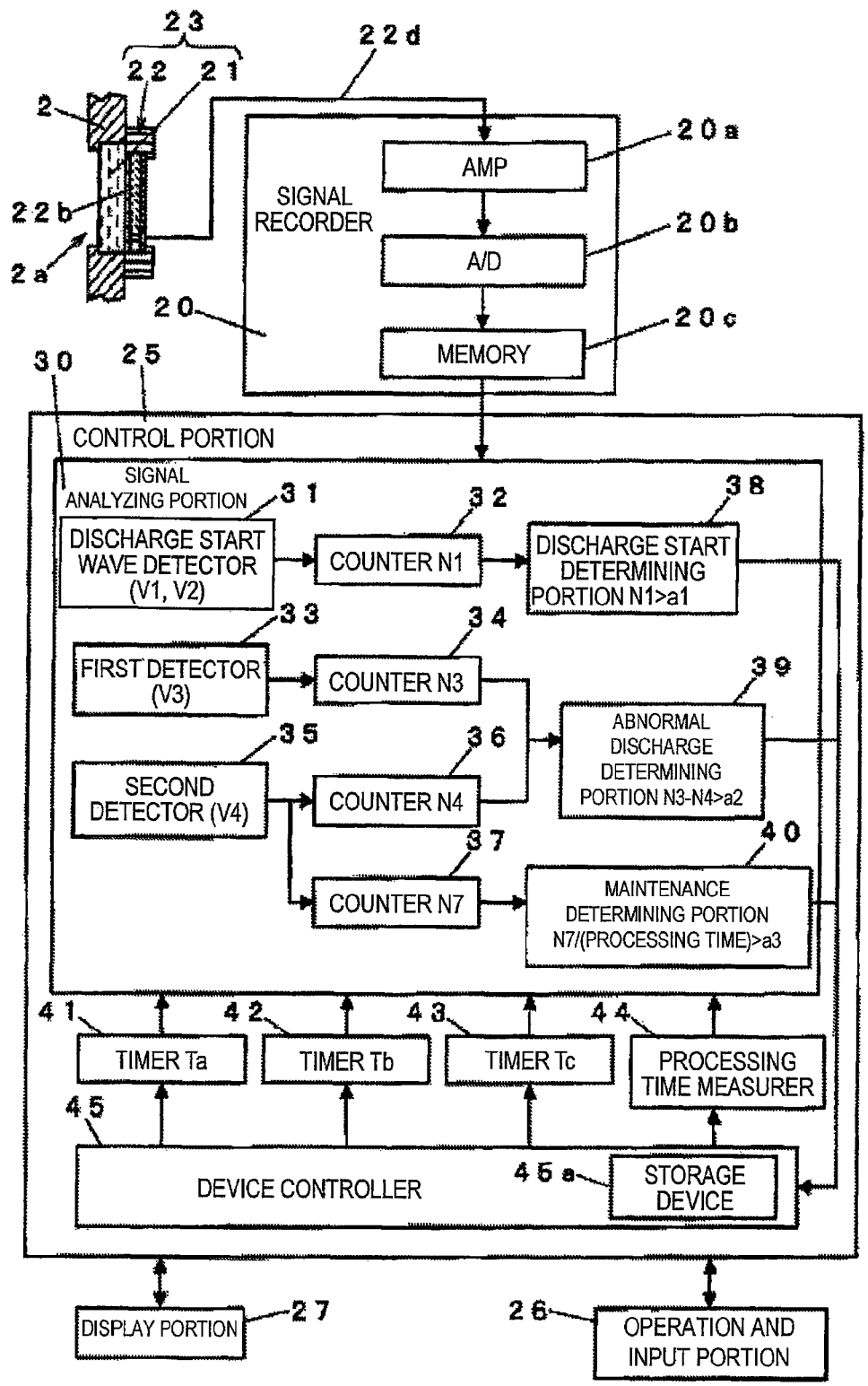
FIG. 3 is a block diagram showing a configuration of a control system of the plasma processing device of one embodiment of the invention.
Figure 4:
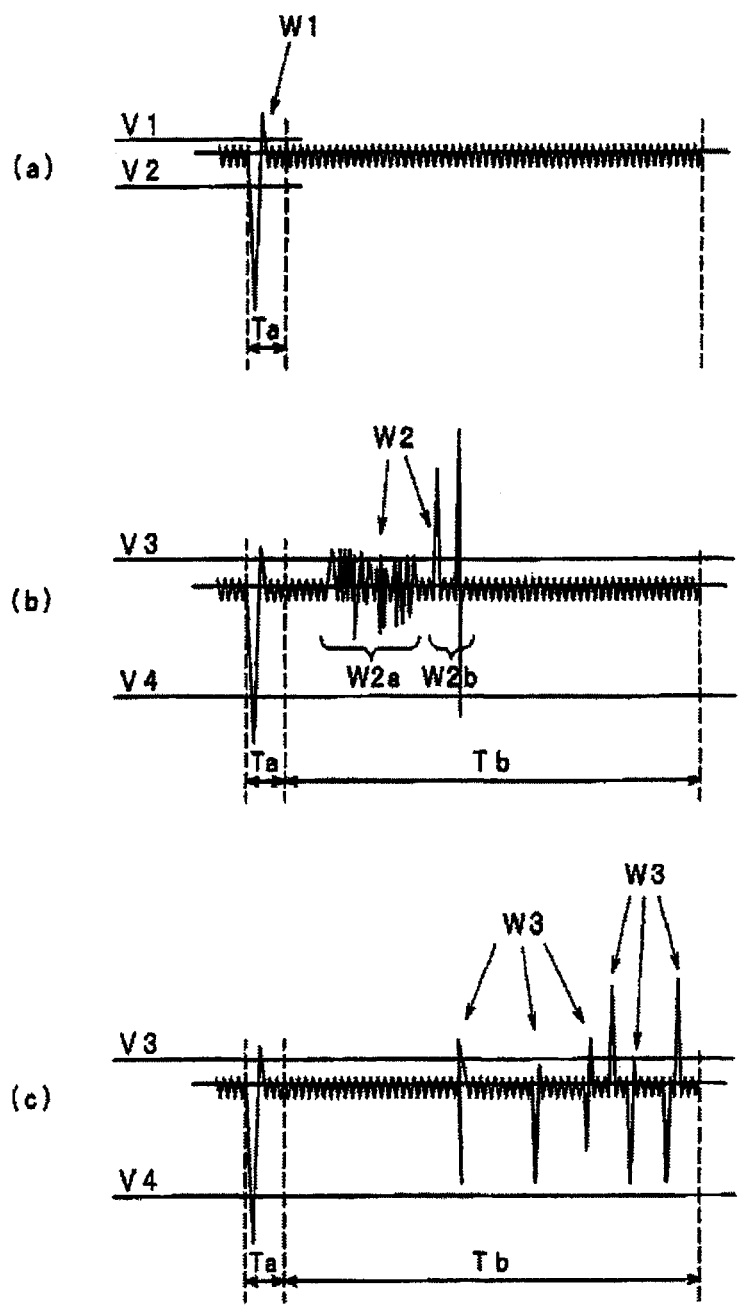
FIG. 4 is an explanatory diagram of a potential change waveform in the plasma processing device of one embodiment of the invention.
Figure 5:
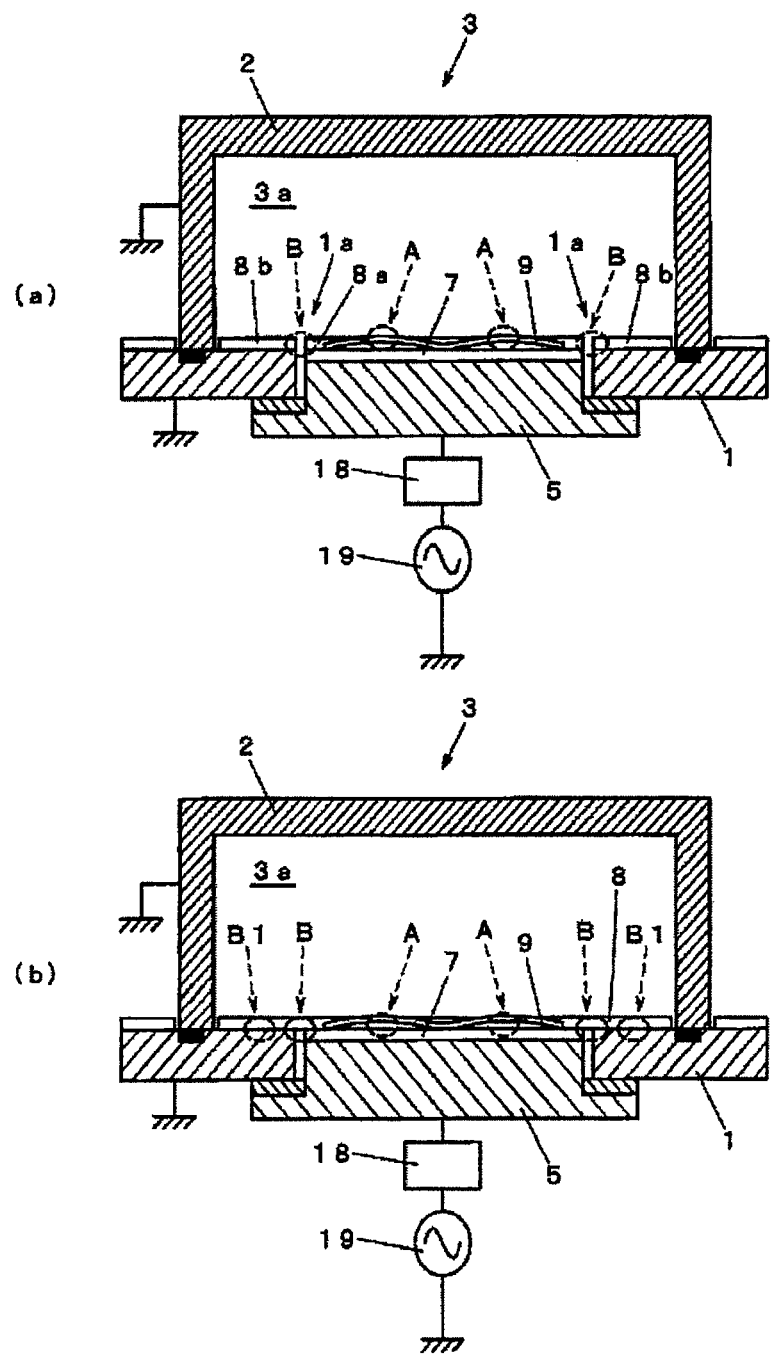
FIG. 5(a) is a diagram showing one example of a guide member 8 and FIG. 5(b) is a diagram showing another example of the guide member 8 in a sectional diagram of the plasma processing device of one embodiment of the invention.
Figure 6:
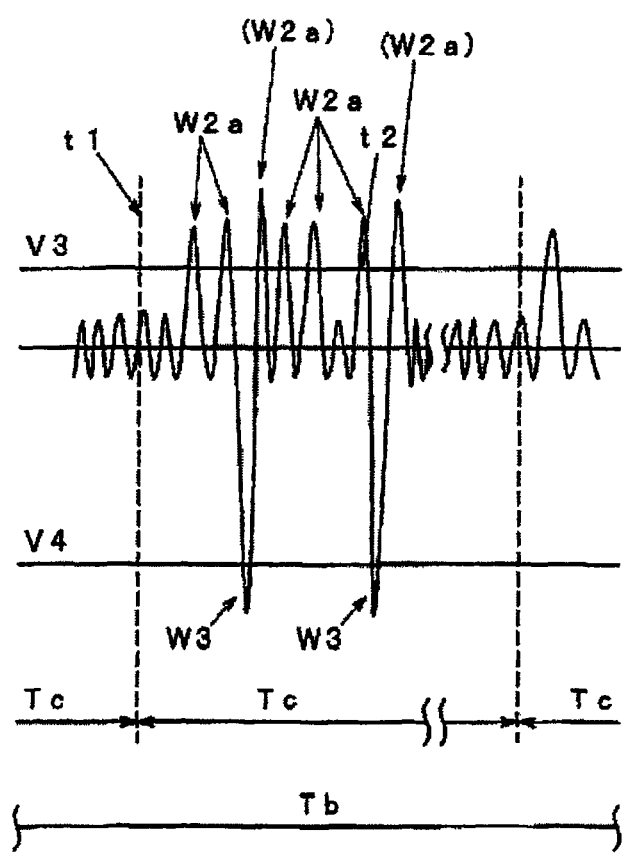
FIG. 6 is an explanatory diagram of computation of the number of detections of arc discharge executed for monitoring a state of discharge in the plasma processing device of one embodiment of the invention.
Figure 7:
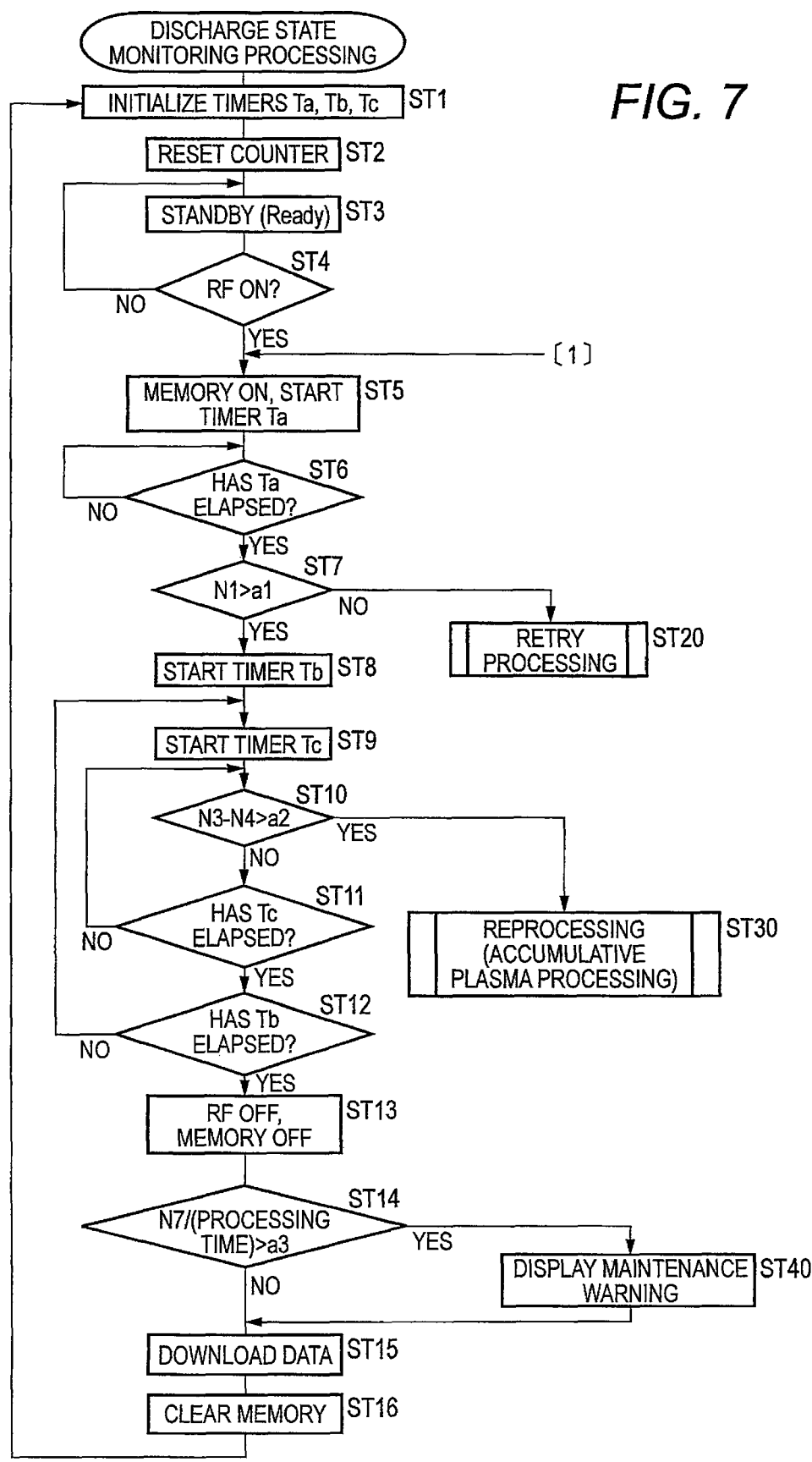
FIG. 7 is a flow diagram showing discharge state monitoring processing in a plasma processing method of one embodiment of the invention.
Figure 8:
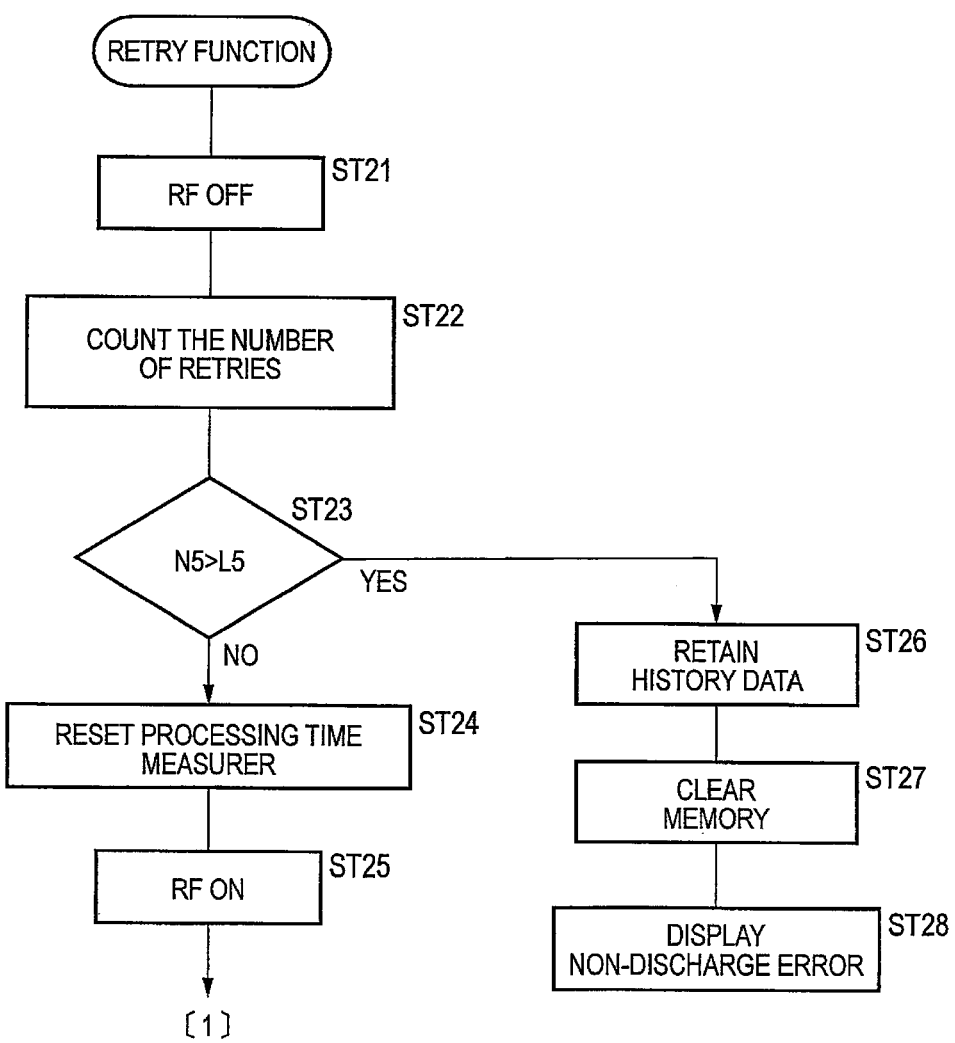
FIG. 8 is a flow diagram showing a retry function of repeating and executing a discharge start operation in the plasma processing method of one embodiment of the invention.
Figure 9:
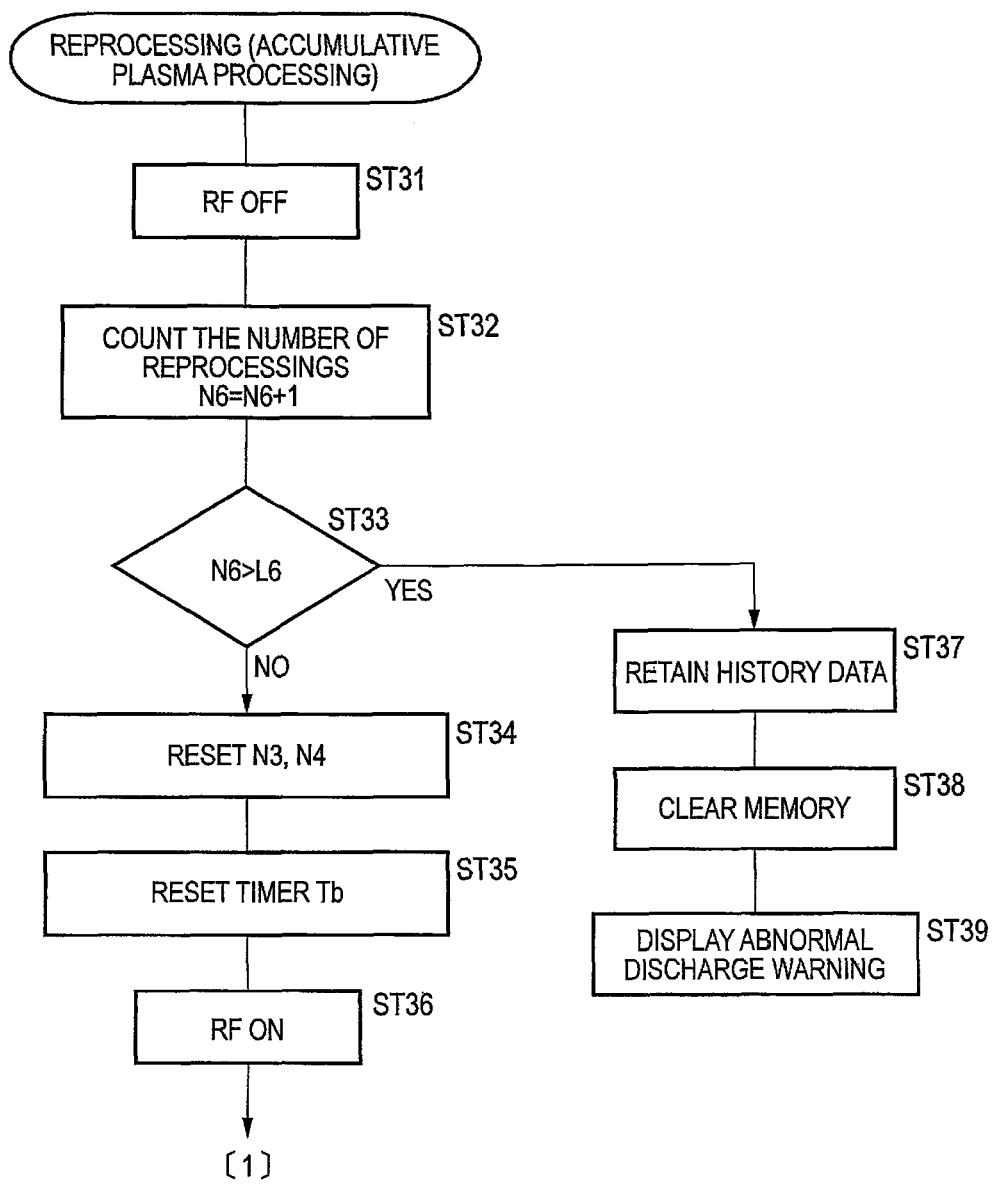
FIG. 9 is a flow diagram showing plasma reprocessing for resuming plasma processing after the plasma processing is suspended in the plasma processing method of one embodiment of the invention.

FIG. 1 is a sectional diagram of a plasma processing device of one embodiment of the invention, and FIG. 2 is a configuration explanatory diagram of a discharge detection sensor used in the plasma processing device of one embodiment of the invention, and FIG. 3 is a block diagram showing a configuration of a control system of the plasma processing device of one embodiment of the invention, and FIG. 4 is an explanatory diagram of a potential change waveform in the plasma processing device of one embodiment of the invention, and FIG. 5(a) is a diagram showing one example of a guide member 8 and FIG. 5(b) is a diagram showing another example of the guide member 8 in a sectional diagram of the plasma processing device of one embodiment of the invention, and FIG. 6 is an explanatory diagram of computation of the number of detections of arc discharge executed for monitoring a state of discharge in the plasma processing device of one embodiment of the invention, and FIG. 7 is a flow diagram showing discharge state monitoring processing in the plasma processing device of one embodiment of the invention, and FIG. 8 is a flow diagram showing a retry function of repeating and executing a discharge start operation in the plasma processing device of one embodiment of the invention, and FIG. 9 is a flow diagram showing plasma reprocessing for resuming plasma processing after the plasma processing is suspended in the plasma processing device of one embodiment of the invention.

First, a structure of a plasma processing device will be described with reference to FIG. 1. In FIG. 1, a vacuum chamber 3 is constructed by arranging a lid portion 2 on a horizontal base portion 1 ascendably and descendably by elevating means (not shown). In a state in which the lid portion 2 descends and abuts on an upper surface of the base portion 1 through a sealing member 4, the vacuum chamber 3 becomes a closed state and hermetically-closed space surrounded by the base portion 1 and the lid portion 2 forms a processing chamber 3a for accommodating an object to be processed and executing plasma processing. An electrode portion 5 is arranged in the processing chamber 3a and the electrode portion 5 is attached to an opening portion 1a installed in the base portion 1 through an insulating member 6 from the lower side. An insulator 7 is attached to an upper surface of the electrode portion 5, and a board 9 which is the object to be processed is transferred into an upper surface of the insulator 7 in a board transfer direction (a direction perpendicular to a paper surface) by guiding the ends of both sides by a guide member 8.

A vent valve 12, a vacuum meter 15, a gas supply valve 13 and a vacuum valve 14 are connected to an open hole 1b provided in the base portion 1 through a pipe line 11. Further, the gas supply valve 13 and the vacuum valve 14 are respectively connected to a gas supply portion 16 and a vacuum pump 17. The inside of the processing chamber 3a is exhausted by opening the vacuum valve 14 in a state of driving the vacuum pump 17. The degree of vacuum at this time is detected by the vacuum meter 15. The vacuum valve 14 and the vacuum pump 17 construct an vacuum exhaust portion for exhausting the gas from the processing chamber 3a by vacuum. Also, a gas which is used for plasma generation is supplied from the gas supply portion 16 into the processing chamber 3a by setting the gas supply valve 13 in an opened state. The gas supply portion 16 incorporates a flow rate adjusting function and can supply the gas which is used for plasma generation of any supply amount to the inside of the processing chamber 3a. Then, the atmosphere is introduced into the inside of the processing chamber 3a at the time of breaking a vacuum by opening the vent valve 12.

A high frequency power supply portion 19 is electrically connected to the electrode portion 5 through a matching device 18. By driving the high frequency power supply portion 19 in a state of exhausting the gas from the processing chamber 3a by vacuum and supplying the gas, a high frequency voltage is applied to the electrode portion 5 between the electrode portion 5 and the lid portion 2 grounded in a ground 10 and thereby, plasma discharge is generated inside the processing chamber 3a. The matching device 18 has a function of matching an impedance of the high frequency power supply portion 19 with an impedance of a plasma discharge circuit for generating the plasma discharge inside the processing chamber 3a.

A circular opening portion 2a for functioning as a peephole for visually recognizing the inside of the processing chamber 3a from the outside of the vacuum chamber 3 is installed in a side surface of the lid portion 2. A discharge detection sensor 23 made of a dielectric member 21 and a probe electrode unit 22 is fixed in the opening portion 2a by a support member 24 from the outside of the lid portion 2. Here, a configuration of the discharge detection sensor 23 will be described with reference to FIG. 2. The dielectric member 21 fabricated from optically transparent glass is attached to the opening portion 2a installed in the lid portion 2. Inside the processing chamber 3a, plasma discharge is generated between the electrode portion 5 and the lid portion 2 and the dielectric member 21 is attached to the opening portion 2a installed in the vacuum chamber 3 in an attitude in which one surface of the dielectric member 21 is opposed to plasma discharge generated inside the processing chamber 3a.

The probe electrode unit 22 is attached to the other surface of the dielectric member 21, that is, the outward surface of the vacuum chamber 3. The probe electrode unit 22 is an integrated component in which a probe electrode 22b is formed on one surface of a glass plate 22a and a shielding electrode 22c is formed on the other surface, and is supported in the lid portion 2 by the support member 24 made of a conductive metal in a state of bringing the probe electrode 22b into close contact with an outer surface (the other surface) of the dielectric member 21 in the case of attaching the probe electrode unit 22 to the dielectric member 21 and forming the discharge detection sensor 23. That is, the discharge detection sensor 23 is configured to have at least the plate-shaped dielectric member 21 attached to the vacuum chamber 3 so as to oppose one surface to plasma discharge generated inside the processing chamber 3a and the probe electrode 22b arranged on the other surface of this dielectric member 21. The probe electrode 22b is connected to a signal recorder 20 through a detection conductor 22d.

In a state of generating plasma discharge inside the processing chamber 3a, the probe electrode 22b becomes a state electrically connected to plasma P through a sheath S which is a space charge layer formed at an interface between the dielectric member 21 and the plasma P generated inside the processing chamber 3a and the dielectric member 21. That is, as shown in FIG. 2, an electrical circuit in which a resistor R had by the plasma P and a capacitor C2 of capacity corresponding to the sheath S and a capacitor C1 formed by the dielectric member 21 are connected in series is formed and a potential according to a state of the plasma P is induced in the probe electrode 22b. In the present embodiment, the potential of the probe electrode 22b is guided to the signal recorder 20 by the detection conductor 22d and a signal of a potential change according to the state of the plasma P is temporarily recorded by the signal recorder 20. That is, the signal recorder 20 has a function of receiving a signal of a potential change induced in the probe electrode 22b according to a change in plasma discharge and temporarily recording the signal as signal data.

When abnormal discharge etc. are generated in the periphery of the board 9 placed on the electrode portion 5 inside the processing chamber 3a, a state of the plasma P of the inside of the processing chamber 3a varies. The variations are detected as a potential change of the probe electrode 22b since an impedance of the circuit described above is changed. This detection of the potential change is extremely high sensitive and it has a feature capable of accurately detecting weak variations which can hardly be detected in a conventional method. The shielding electrode 22c has a function of electrically shielding the outer surface side of the probe electrode 22b, and a charge occurring in the portion electrode 22c is released to the grounded lid portion 2 through the conductive support member 24. Consequently, noise to a potential change induced in the probe electrode 22b is reduced.

In the embodiment, both of the probe electrode 22b and the portion electrode 22c are formed by coating a surface of the glass plate 22a with a transparent conductive substance such as ITO in a film shape. Consequently, it is constructed so that the inside of the processing chamber 3a can be visually recognized from the outside of the lid portion 2 through the opening portion 2a in a state of attaching the discharge detection sensor 23 to the opening portion 2a. That is, the discharge detection sensor 23 shown in the embodiment uses a configuration in which the dielectric member 21 is made of optically transparent glass attached to the opening portion 2a for visually recognizing the inside of the processing chamber 3a from the outside of the vacuum chamber 3 and the probe electrode 22b is made of an optically transparent conductive substance.

By such a configuration, the peep-hole for visually recognizing the inside of the processing chamber 3a and the probe electrode 22b for monitoring a plasma discharge state can be shared. Also, the dielectric member 21 is exposed to the plasma P of the inside of the processing chamber 3a, so that wear damage to a surface occurs and it is necessary to replace the dielectric member 21 at a predetermined interval. Also in this case, the probe electrode unit 22 and the dielectric member 21 are constructed of different components, so that only the dielectric member 21 as a consumable part could be replaced and it is unnecessary to replace the probe electrode unit 22.

The plasma processing device includes a control portion 25 for executing the whole operation control. The control portion 25 controls the vent valve 12, the gas supply valve 13, the vacuum valve 14, the vacuum portion 15, the gas supply portion 16, the vacuum pump 17 and the high frequency power supply portion 19 and thereby, each operation necessary for plasma processing is executed. Also, the control portion 25 executes the following signal analysis etc. by referring to signal data recorded in memory 20c while executing writing control of the memory 20c of the signal recorder 20. The control portion 25 includes an operation and input portion 26 and a display portion 27, and the operation and input portion 26 inputs data or various operations at the time of executing a plasma processing operation. The display portion 27 displays a determination result determined by the control portion 25 based on signal data recorded in the signal recorder 20 in addition to an operation screen at the time of input by the operation and input portion 26.

Next, configurations and functions of the signal recorder 20 and the control portion 25 will be described with reference to FIG. 3. In FIG. 3, the signal recorder 20 includes an AMP (amplifier) 20a, an A/D converter 20b and the memory 20c. The AMP 20a amplifies a potential change of the probe electrode 22b transmitted through the detection conductor 22d. The A/D converter 20b makes AD conversion of a signal of the potential change amplified by the AMP 20a. A voltage displacement signal in which AD conversion is made by the A/D converter 20b, that is, a digital signal indicating the potential change is temporarily recorded in the memory 20c according to writing control of the control portion 25 and also a signal recorded by a clear command from the control portion 25 is erased.

The control portion 25 includes a signal analyzing portion 30, a timer 41 (first timer), a timer 42 (second timer), a timer 43 (third timer), a processing time measurer 44 and a device control portion 45. The signal analyzing portion 30 has a function of executing analysis processing for detecting a signal of a potential change induced in the probe electrode 22b according to a change in plasma discharge with reference to signal data recorded in the memory 20c of the signal recorder 20 and monitoring a discharge state inside the processing chamber 3a based on these detection signals. Since an interval at which the signal analyzing portion 30 refers to the signal data of the memory 20c is extremely short time, it is constructed so that a state of plasma discharge can be monitored in substantially real time. In order to implement this function, the signal analyzing portion 30 include a discharge start wave detector 31, a counter 32 (discharge start wave counter), a first detector 33, a counter 34 (first counter), a second detector 35, a counter 36 (second counter), a counter 37 (maintenance determining counter), a discharge start determining portion 38, an abnormal discharge determining portion 39 and a maintenance determining portion 40.

Here, a waveform pattern of a waveform detected by receiving a potential change by the discharge detection sensor 23 at the time of operation of this plasma processing device and a kind of abnormal arc discharge occurring inside the processing chamber 3a with operation of the plasma processing device and its detection algorithm will be described with reference to FIG. 4. FIGS. 4(a), 4(b) and 4(c) show waveform patterns detected in a process ranging from a start of operation to an end of operation of the plasma processing device, that is, for predetermined times (initial monitoring time Ta, set processing time Tb) respectively preset in the timers 41 and 42.

The initial monitoring time Ta is monitoring time for determining whether or not plasma discharge is normally started inside the processing chamber 3a at the beginning of a discharge start of turning on the high frequency power supply portion 19, and when a waveform with normal discharge is not detected by a lapse of the initial monitoring time Ta, retry processing for restarting discharge is executed as described below. Also, the set processing time Tb means duration time of plasma processing set according to an object to be processed. The processing time measurer 44 has a function of measuring actual time for which plasma processing is actually executed, and timing is started by turning on the high frequency power supply portion 19 and the timing is ended or suspended by turning off the high frequency power supply portion 19.

In the initial monitoring time Ta, a waveform pattern peculiar to a change in a plasma discharge state by a start of application of high frequency power supply portion, that is, a waveform W1 (discharge start waveform) returning to a steady state after potential swings greatly to both the positive and negative sides as shown in FIG. 4(a) is detected. In the steady state in which plasma discharge is normally generated, waveforms with regular infinitesimal amplitude in synchronization with an RF period are generated continuously. The waveform W1 is detected by the discharge start wave detector 31. That is, the discharge start wave detector 31 detects the waveform W1 of a potential change with a start of discharge indicating that plasma discharge is normally started inside the processing chamber 3a with reference to signal data stored in the memory 20c. A value of a potential change exceeds a determination threshold value V1(+) for discharge start wave detection set in the positive voltage side to the positive side or exceeds a determination threshold value V2(−) for discharge start wave detection set in the negative voltage side to the negative side within the initial monitoring time Ta timed by the timer 41 or both of these cases occur and thereby, this waveform W1 is detected. Then, the discharge start wave detector 31 steps the corresponding counter 32 every time the waveform W1 is detected.

During a lapse of the set processing time Tb, a waveform of a potential change resulting from an abnormal phenomenon, that is, a waveform with abnormal discharge and a waveform with micro-arc discharge become an object of monitoring. The abnormal discharge is abnormal arc discharge (first arc discharge) occurring between the electrode portion 5 and the board 9 which is an object to be processed which is placed on the electrode portion 5, and occurs in the case where a gap (arrow A) occurs between the board 9 and the insulator 7, for example, a state in which the board 9 having warpage deformation is placed on the electrode portion 5 as shown in FIG. 5. Since such abnormal discharge occurring between the electrode portion 5 and the board 9 becomes a cause of poor quality by thermal damage such as burnout of the board 9, the occurrence needs to be prevented as much as possible.

When such abnormal discharge occurs, a temporal potential change of the probe electrode 22b appears as a waveform W2 (first waveform) as shown in FIG. 4(b). Here, the waveform W2 of a potential change with the abnormal discharge includes two kinds of a waveform W2a indicating a foretaste of the abnormal discharge and a waveform W2b indicating that the abnormal discharge actually occurs in a region of an arrow A shown in FIG. 5. The waveform W2a occurs due to the fact that a discharge state becomes unstable before the abnormal discharge, and appears as unstable variations such as disturbance of a period or enlargement of amplitude from a steady state in which regular infinitesimal amplitude continues. In addition, a period of generation of the waveform W2a is about several µs and is very short. Also, the waveform W2b appears as large variations in amplitude in a short time by generation of sudden arc discharge. The plasma processing device shown in the embodiment is constructed so as to prevent thermal damage to the board 9 with abnormal discharge by stopping plasma discharge before the abnormal discharge actually occurs between the board 9 and the electrode portion 5 by detecting the waveform W2a and grasping a foretaste of the abnormal discharge.

The waveforms W2a, W2b are detected by the first detector 33. That is, the first detector 33 detects the waveforms W2a, W2b of a potential change with abnormal discharge inside the processing chamber 3a with reference to signal data temporarily recorded in the memory 20c similarly. A potential change exceeds a determination threshold value V3(+) (first threshold value) for abnormal discharge detection set in the positive voltage side to the positive side within the set processing time Tb timed by the timer 42 and thereby, this waveform W2 is detected. The determination threshold value V3 is set at a value capable of surely detecting the waveform W2a based on actual waveform data obtained by the plasma processing device. Then, the first detector 33 steps the corresponding counter 34 every time the waveforms W2a, W2b are detected. In addition, the embodiment is constructed so as to stop plasma discharge when the waveform W2a is detected predetermined times as described below, so that the waveform W2b is not detected actually in a state in which a device function operates normally.

Next, micro-arc discharge will be described. The micro-arc discharge means arc discharge other than abnormal discharge occurring between the electrode portion 5 and the board 9 inside the processing chamber 3a, that is, minute arc discharge occurring between the portion such as the guide member 8 to which a high frequency voltage is applied and the portion of ground potential of the periphery. Then, in the embodiment, such micro-arc discharge corresponds to arc discharge (second arc discharge) other than the first arc discharge.

That is, the micro-arc discharge occurs due to a situation in which a foreign substance occurring by execution of plasma processing is deposited on a discontinuous portion (arrow B) etc. in which the guide member 8 for guiding transfer of the board 9 is divided into a guide portion 8b on the base portion 1 and a guide member 8a on the electrode portion 5 in the opening portion 1a and insulation properties reduce as shown in FIG. 5(a). Particularly, fine particles of metal or resin removed from work by sputtering action of plasma processing tend to be deposited on the portion difficult to have an effect of again removing a deposited foreign substance by a direct shot of plasma from above, for example, a side surface of the guide member 8 or an inside surface of the opening portion 1a. As a result of this, insulation properties reduce in these regions and the micro-arc discharge occurs between the grounded base portion 1 and the regions.

In this case, disturbance in which the micro-arc discharge is given to a plasma discharge state of the inside of the processing chamber 3a is small, so that a waveform temporally showing a potential change of the probe electrode 22b becomes a potential change waveform pattern returning to a steady state after potential swings to both the positive and negative sides (only the negative voltage side depending on discharge characteristics) like a waveform W3 shown in FIG. 4(c). This waveform 3 has a characteristic waveform pattern of swinging greater to the negative voltage side. In addition, micro-arc discharge also occurs in a joint (arrow B1) between the base portion 1 and the guide member 8 when the guide member 8 is installed continuously on the base portion 1 and the electrode portion 5 astride the opening portion 1a like an example shown in FIG. 5(b).

Such micro-arc discharge is detected by the second detector 35. That is, the second detector 35 detects the waveform W3 (second waveform) of a potential change with the micro-arc discharge occurring due to deposition of a foreign substance inside the processing chamber 3a with reference to signal data recorded in the memory 20c similarly. A potential change exceeds a determination threshold value V4(−) (second threshold value) for micro-arc detection set in the negative voltage side to the negative side within the set processing time Tb and thereby, this waveform W3 is detected. The determination threshold value V4 is set based on actual waveform data obtained by the plasma processing device, and is set at a value capable of surely detecting the waveform W3 and an absolute value larger than the determination threshold value V3(+) for abnormal discharge detection to the negative voltage side in view of the characteristic waveform pattern described above. Then, the second detector 35 steps the corresponding counters 36 and 37 every time the waveform W3 is detected. In addition, frequency of generation of the waveform 3 varies depending on a foreign substance deposition state inside the processing chamber 3a, and there are many cases of being about several tens ms to several hundreds ms much larger than a period of the waveform W2a generally.

Determination processing executed based on plural count values obtained in this manner will be described. A count result of the counter 32 is first outputted to the discharge start determining portion 38 as a count value N1 (discharge start wave count value). The discharge start determining portion 38 compares the received count value N1 with a preset threshold value a1, and determines that plasma discharge is started inside the processing chamber 3a when the count value N1 exceeds the threshold value a1. A determination result is outputted to the device control portion 45. Also, a count result of the counter 34 and a count result of the counter 36 are respectively outputted to the abnormal discharge determining portion 39 as a count value N3 and a count value N4. The abnormal discharge determining portion 39 executes processing for determining the presence or absence of possibility of generation of abnormal discharge inside the processing chamber 3a based on the count value N3 (first count value) and the count value N4 (second count value).

Here, abnormal discharge determination processing executed by the abnormal discharge determining portion 39 will be described with reference to FIG. 6. A main purpose of discharge state monitoring in the embodiment is to prevent generation of abnormal discharge between the electrode portion 5 and the board 9 with fear of burnout of the board 9 which is an object to be processed as described above. Then, this means is constructed so that the waveform W2a as a foretaste of abnormal discharge is surely detected and it is determined that possibility of generation of abnormal discharge is present when this number of detections exceeds a preset threshold value and the high frequency power supply portion 19 is turned off and plasma discharge is stopped.

As described above, in the waveform W2a generated before abnormal discharge, a potential change exceeds the determination threshold value V3 set in the positive voltage side and thereby the number of detections is counted. However, the waveform W3 with micro-arc discharge also often becomes a waveform in which a potential change swings to both the positive and negative sides with amplitude larger than a waveform of a steady state, so that the potential change exceeds the determination threshold value V3 when the waveform W3 swings to the positive voltage side as shown in FIG. 6. That is, though a generation cause is the waveform W3 with micro-arc discharge, the first detector 33 for detecting the waveforms W2a based on the determination threshold value V3 decides that this waveform W3 is the waveform W2a, and counts (see a waveform shown by (W2a) in FIG. 6). As a result of this, the number of detections of the waveform W3 is added to the count value N3 of the counter 34 in addition to the number of detections of the waveform W2a to be essentially detected and a count result lacks reliability from the standpoint of an essential detection purpose.

In order to detect such a waveform W2a with high reliability, the embodiment is constructed so as to properly determine possibility of generation of abnormal discharge by combining a count result by the first detector 33 with a count result by the second detector 35 as described below. That is, in order to correct an error by adding the number of detections of the waveform W3, the abnormal discharge determining portion 39 executes computation for subtracting the count value N4 indicating the number of detections of the waveform W3 from the count value N3 and obtaining a difference. Then, by regarding this difference as the number of detections of the waveform W2a of the essential purpose and comparing this difference with a preset threshold value a2, abnormal discharge is determined. This computation for error correction is newly repeated and executed every time computation reset time Tc which is a preset predetermined time has elapsed, and a computation result is reset every computation reset time Tc.

Here, a concrete example of the abnormal discharge determination processing and computation processing executed for such a purpose will be described. Here, a processing example of the case of setting the threshold value a2 at 3 will be described in FIG. 6. During a lapse of the set processing time Tb, processing for counting waveforms of respective detection objects by the first detector 33 and the second detector 35 is executed as described above after timing t1 of a start of timing of the repeated computation reset time Tc. That is, here, a potential change exceeds the determination threshold value V3 to the positive voltage side and thereby, the first detector 33 detects the waveform W2a two times and consequently the count value N3 becomes 2.

Then, a potential change exceeds the determination threshold value V4 to the negative voltage side and thereby, the count value N4 becomes 1 and at this point in time, a difference (N3−N4) becomes 1. Then, the difference (N3−N4) becomes 4 at timing t2 at which the first detector 33 further detects the waveform W2a three times, and exceeds the value 3 of the threshold value a2 at this point in time. Consequently, the abnormal discharge determining portion 39 determines that possibility of generation of abnormal discharge is present, and a determination result is outputted to the device control portion 45. That is, the abnormal discharge determining portion 39 executes processing for determining the presence or absence of possibility of generation of abnormal discharge inside the processing chamber 3a by executing computation for obtaining a difference between the count value N3 and the count value N4 and comparing the obtained difference with the threshold value a2 while the computation reset time Tc which is a predetermined time prescribed by the timer 43 has elapsed.

In addition, the computation reset time Tc is set with reference to an actual trial result in view of the set threshold value a2 and discharge characteristics of the plasma processing device so that the abnormal discharge determination processing described above can be executing properly. That is, in an object device, average frequency of generation and a period of generation of the waveform W2a are first acquired as actual measured data and possibility of false determination is eliminated as much as possible from the data and the threshold value a2 and the computation reset time Tc is set so that abnormal discharge determination can be made properly.

When the computation reset time Tc is too short, the computation reset time Tc is up before the difference (N3−N4) reaches the threshold value a2 though the waveform W2a is generated at some frequency, there is a possibility that an exact determination result is not obtained. Also, when the computation reset time Tc is too long, the number of detections of the waveform W2a is moderately offset by the waveform W3 detected at high frequency when frequency of generation of the waveform W3 is high. As a result of this, similarly, the difference (N3−N4) does not reach the threshold value a2 though the waveform W2a is generated at some frequency, there is a possibility that an exact determination result is not obtained.

The maintenance determining portion 40 determines necessity of maintenance by regarding frequency of detection of the waveform W3 by the second detector 35 as an index indicating the extent of stain of the inside of the processing chamber 3a. That is, processing for determining necessity of maintenance such as cleaning of the inside of the processing chamber 3a by comparing a predetermined threshold value a3 with a value (the number of detections of the waveform W3 per unit time) in which a count value N7 (count value for maintenance determination) counted by the counter 37 is divided by processing time of an object is executed.

That is, in the plasma processing device shown in the embodiment of the invention, the determination threshold value V3 (first threshold value) for abnormal discharge detection for detecting a signal of a potential change induced by abnormal discharge (first arc discharge) generated between the electrode portion 5 and the board 9 is set in the first detector 33 and the determination threshold value V4 (second threshold value) for micro-arc discharge detection for detecting a signal of a potential change induced by arc discharge (second arc discharge) other than the abnormal discharge described above is set in the second detector 35. Then, an absolute value of the second threshold value is set larger than an absolute value of the first threshold value and further, the first threshold value is opposite to the second threshold value in positive and negative signs. By setting such determination threshold values, the micro-arc discharge and the abnormal discharge having the characteristic waveform patterns as described above can be detected surely.

Then, the signal analyzing portion 30 include the first detector 33 for detecting a signal of a potential change induced by the first arc discharge generated between the electrode portion 5 and the board 9 which is an object to be processed, the second detector 35 for detecting a signal of a potential change induced by the second arc discharge other than the first arc discharge, and the abnormal discharge determining portion 39 for obtaining a difference between the number of detections of the first detector 33 and the number of detections of the second detector 35 within the computation reset time Tc which is predetermined time and determining the presence or absence of possibility of generation of abnormal discharge inside the processing chamber 3a based on this difference.

Next, a function of the device control portion 45 will be described. As described above, the device control portion 45 together includes a storage device 45a for storing a processing history and a function of executing predetermined associated processing for properly executing the plasma processing operation based on a determination result of discharge state monitoring of plasma discharge by the signal analyzing portion 30 along with a normal operation control function of controlling the high frequency power supply portion 19, the gas supply portion 16 and the vacuum exhaust portion made of the vacuum valve 14 and the vacuum pump 17 and executing the plasma processing operation.

These associated processing includes a retry function of executing retry processing for repeating and executing a discharge start operation when plasma discharge is not started normally, and an accumulative plasma processing function of executing plasma reprocessing for resuming plasma processing to the same object to be processed after abnormal discharge is detected and plasma processing is suspended. As the processing history, data such as the count values N1, N3, N4, N5, N6, N7 or signal data temporarily recorded in the memory 20c is stored as processing history data by the plasma processing device. Consequently, with respect to a board in which processing is executed by the plasma device, detailed history data can be acquired and traceability for quality management or production management is ensured.

Next, processing for monitoring a discharge state inside the processing chamber 3a in plasma processing executed by the plasma processing device shown in the embodiment in a state of accommodating an object to be processed inside the processing chamber 3a will be described with reference to FIG. 7. First, the initial monitoring time Ta of the timer 41, the set processing time Tb of the timer 42 and the computation reset time Tc are initialized from previously given empirical values or characteristic data etc. of the board 9 of an object to be processed (ST1). Next, the count values N1, N3, N4, N5, N6, N7 are reset and also the processing time measurer 44 is reset (ST2). In addition, the count values N5, N6 are respectively count values by counters installed as an internal function in a retry function and an accumulative plasma processing function associated with the device control portion 45.

Thereafter, the plasma processing device becomes a standby state (ST3), and monitors whether or not an RF (radio-frequency power source) is turned on (ST4), and when ON is checked, the memory 20c is turned on and it is set in a writable state and also timing of the initial monitoring time Ta by the timer 41 and processing time measurement by the processing time measurer 44 are started (ST5). Consequently, recording by the signal recorder 20 of a detection signal of the discharge detection sensor 23 is started. That is, a signal of a potential change induced in the probe electrode 22b of the discharge detection sensor 23 according to a change in plasma discharge is received by the signal recorder 20 and is temporarily stored in the memory 20c as signal data indicating the potential change (a signal recording step).

Then, thereafter, analysis processing for discharge state monitoring of plasma discharge inside the processing chamber 3a with reference to signal data temporarily stored in the memory 20c is executed by the signal analyzing portion 30 (a signal analysis step). First, until the initial monitoring time Ta has elapsed (ST6), a discharge start wave (waveform W1 shown in FIG. 4(a)) is detected by the discharge start wave detector 31 of the signal analyzing portion 30 and processing for counting a detection wave is executed. That is, when a detected voltage V exceeds the determination threshold value V1(+) to the positive voltage side or exceeds the determination threshold value V2(−) to the negative voltage side, processing for adding 1 to the count value N1 by the counter 32 is executed.

When a lapse of the initial monitoring time Ta is checked thereafter (ST6), it is decided whether or not the count value N1 exceeds the threshold value a1 set for discharge start determination (ST7). When the count value N1 exceeds the threshold value a1 herein, it is decided that plasma discharge is started normally, and timing of the set processing time Tb is started by the timer 42 (ST8). Also, when the count value N1 does not exceed the threshold value a1, it is decided that plasma discharge is not started normally, and the flow diagram proceeds to retry processing shown in FIG. 8 (ST20).

Here, the retry processing will be described. This retry processing is processing executed by the retry function associated with the device control portion 45, and after the RF (radio-frequency power source) is first turned off once (ST21), 1 is added to the count value N5 of the number of retries and updating is executed (ST22). Next, it is decided whether or not the count value N5 exceeds a preset upper limit value L5 (properly set in a range of about 1 to 5 times) (ST23). When the count value N5 does not exceed the upper limit value L5 herein, the count value N3 and the processing time measurer 44 are reset (ST24). Then, thereafter, the RF (high frequency power supply portion 19) is again turned on (ST25), and the flow diagram returns to [1] of the main flow shown in FIG. 7 and subsequent processing is repeated and executed similarly.

On the other hand, when the count value N5 exceeds the upper limit value L5 in (ST23), it is decided that it is in an abnormal error state. That is, in this case, the count value, record data, etc. of the memory 20c are retained in the storage device 45a of the device control portion 45 as history data (ST26) and after the contents of storage of the memory 20c are then cleared (ST27), a non-discharge error is displayed (ST28). Then, an operator receiving this display accesses the device and takes necessary measures.

When plasma discharge is started normally, the flow diagram proceeds to (ST8) shown in FIG. 7 and timing of the set processing time Tb by the timer 42 is started. Then, timing of the computation reset time Tc by the timer 43 is started and thereafter, until the computation reset time Tc has elapsed (ST11), the following processing for discharge state monitoring is executed. That is, the waveform W2a indicating a foretaste of abnormal discharge is detected by the first detector 33 and a detection result is counted and the count value N3 is acquired and also micro-arc discharge is detected by the second detector 35 and the count value N4 is acquired.

Then, processing for obtaining a difference (N3−N4) and comparing this difference with the threshold value a2 is executed by the abnormal discharge determining portion 39 (ST10). Then, when the difference (N3−N4) exceeds the threshold value a2, it is determined that a foretaste of abnormal discharge is detected and there is a possibility of generating the abnormal discharge, and the flow diagram proceeds to reprocessing (accumulative plasma processing) shown in FIG. 9 (ST30). Also, when the computation reset time Tc has elapsed in a state in which the difference (N3−N4) does not exceed the threshold value a2 in (ST10), a lapse of the set processing time Tb is decided (ST12). When the set processing time Tb has not elapsed yet herein, the flow diagram returns to (ST9) and timing of the computation reset time Tc is newly repeated and also the processing for discharge state monitoring is executed repeatedly. Then, the count values N3, N4 are reset every each computation reset time Tc.

Here, the reprocessing (accumulative plasma processing) will be described. This reprocessing (accumulative plasma processing) is processing executed by the accumulative plasma processing function associated with the device control portion 45, and processing for turning off the RF (radio-frequency power source) once is first executed herein (ST31). Consequently, plasma discharge is suspended at a stage of a foretaste in which abnormal discharge is generated between the electrode portion 5 and the board 9, and thermal damage to the board 9 by the abnormal discharge can be prevented surely. Then, 1 is added to the count value N6 of the number of reprocessings and updating is executed (ST32) and further, it is decided whether or not the count value N6 exceeds a preset upper limit value L6 (properly set in a range of about 1 to 5 times) (ST33). When the count value N6 does not exceed the upper limit value L6 herein, after the count values N3, N4 are reset (ST34), the set processing time Tb of the timer 42 is reset (ST35).

That is, unprocessed time about the board 9 of the object to be processed is obtained from the set processing time Tb set already and the processing time recorded in the processing time measurer 44 and based on this unprocessed time, the set processing time Tb of the timer 38 is newly set. Then, the RF (radio-frequency power source) is again turned on (ST36), and the flow diagram returns to [1] of the main flow shown in FIG. 7 and subsequent processing is repeated and executed similarly. Consequently, even when plasma discharge is once suspended by detecting a foretaste of abnormal discharge, the preset proper processing time is ensured.

In addition, a state as to whether or not to reset the set processing time Tb shown in (ST35) can be preset by a desired reprocessing aspect. That is, the set processing time Tb is reset when it is necessary to maintain processing time constant strictly in the case of executing reprocessing with respect to the same object to be processed. On the other hand, in the case where there is no influence on processing quality even when substantial processing time becomes long, the set processing time Tb is not changed and may remain the default value. Also, when the count value N6 exceeds the upper limit value L6 in (ST33), it is decided that it is in an error state in which abnormality occurs repeatedly, and the count value, record data, etc. of the memory 20c are retained in the storage device 45a of the device control portion 45 as history data (ST37) and after the contents of storage of the memory 20c are then cleared (ST38), an abnormal discharge warning is displayed (ST39). Then, an operator receiving this display accesses the device and takes necessary measures.

Thereafter, the flow diagram again returns to the main flow of FIG. 7 and when the set processing time Tb has elapsed in (ST12), the RF (radio-frequency power source) is turned off and also writing of the memory 20c is turned off (ST13). Then, processing for determining necessity of maintenance such as cleaning of the inside of the processing chamber 3a by obtaining a value in which the counter value N7 of the counter 37 is divided by processing time as an index indicating the extent of stain of the inside of the processing chamber 3a and comparing a value of this index with the predetermined threshold value a3 is executed. When the obtained index value exceeds the threshold value a3 herein, a maintenance warning to the effect that it is necessary to take measures (for example, replacement of an internal cover member or cleaning of the inside of the processing chamber 3a) against deposition of a foreign substance is displayed (ST40).

Also, when the obtained index value does not exceed the threshold value a3 in (ST14), data recorded in the memory 20c or the count value acquired in a processing process is downloaded into the storage device 45a of the device control portion 45 (ST15). Then, the contents of storage of the memory 20c are cleared (ST16) and the flow diagram returns to the state before execution of (ST1).

That is, the signal analysis step shown in (ST5) to (ST12) is constructed so that a signal of a potential change induced by abnormal discharge (first arc discharge) generated between the electrode portion 5 and the board 9 which is an object to be processed is detected by the first detector 33 and a signal of a potential change induced by micro-arc discharge (second arc discharge) other than the first arc discharge is detected by the second detector 35 and by the abnormal discharge determining portion 39, a difference (N3−N4) between the count value N3 which is the number of detections of the first detector 33 and the count value N4 which is the number of detections of the second detector 35 within the computation reset time Tc which is predetermined time is obtained and the presence or absence of possibility of generation of abnormal discharge is determined based on this difference (N3−N4). Consequently, a state of plasma discharge can properly be monitored to detect a foretaste of abnormal discharge, and thermal damage such as burnout of an object to be processed by the abnormal discharge can be prevented.

The invention has been described in detail with reference to the specific embodiment, but it is apparent to those skilled in the art that various changes or modifications can be made without departing from the spirit and scope of the invention.

The present application is based on Japanese patent application (patent application No. 2008-172974) filed on Jul. 2, 2008, and the contents of the patent applications are hereby incorporated by reference.

INDUSTRIAL APPLICABILITY

A plasma processing device and a plasma processing method of the invention have an effect capable of properly monitoring a state of plasma discharge and detecting a foretaste of abnormal discharge, and are useful in a field of executing plasma processing such as plasma cleaning using a board etc. as an object to be processed.

DESCRIPTION OF REFERENCE SIGNS

2 LID PORTION
3 VACUUM CHAMBER
3a PROCESSING CHAMBER
5 ELECTRODE PORTION
8 GUIDE MEMBER
9 BOARD
15 VACUUM METER
16 GAS SUPPLY PORTION
17 VACUUM PUMP
18 MATCHING DEVICE
19 HIGH FREQUENCY POWER SUPPLY PORTION
21 DIELECTRIC MEMBER
22 PROBE ELECTRODE PORTION
22b PROBE ELECTRODE
23 DISCHARGE DETECTION SENSOR
P PLASMA

The invention claimed is:

1. A plasma processing device comprising:
a vacuum chamber that forms a processing chamber;
an electrode portion arranged in the processing chamber and electrically isolated from the vacuum chamber;
an vacuum exhaust portion configured to exhaust a gas from the processing chamber by vacuum;
a gas supply portion configured to supply a gas which is used for plasma generation into the processing chamber;
a high frequency power supply portion configured to generate plasma discharge in the processing chamber when a high frequency voltage is impressed onto the electrode portion;
a matching device configured to match an impedance of a plasma discharge circuit configured to generate the plasma discharge with an impedance of the high frequency power supply portion;
a discharge detection sensor comprising, at least, a plate-shaped dielectric member arranged such that one surface thereof opposes plasma discharge generated in the processing chamber, and a probe electrode arranged on the other surface of the dielectric member; and a signal analyzing portion configured to determine a signal of a potential change induced in the probe electrode in response to a change in the plasma discharge and execute analysis processing for monitoring a state of discharge, wherein said plasma processing device is configured to execute plasma processing for an object to be processed which is placed on the electrode portion to plasma processing, wherein the signal analyzing portion comprises:

a first detector configured to determine a signal of a potential change induced by first arc discharge generated between the electrode portion and the object to be processed;

a second detector configured to determine a signal of a potential change induced by second arc discharge other than the first arc discharge; and an abnormal discharge determining portion configured to obtain a difference between a number of determinations by the first detector and a number of determinations by the second detector within predetermined time, to compare the difference with a threshold value, and to determine that there is a possibility of generation of abnormal discharge in the processing chamber if the difference exceeds the threshold value, wherein a first threshold value for determining the signal of the potential change induced by the first arc discharge is set in the first detector, wherein a second threshold value for determining the signal of the potential change induced by the second arc discharge is set in the second detector, wherein an absolute value of the second threshold value is larger than an absolute value of the first threshold value, and wherein a positive or negative sign of the first threshold value is opposite to that of the second threshold value.

2. A method of monitoring a state of discharge in a plasma processing device, the plasma processing device comprising: a vacuum chamber that forms a processing chamber; an electrode portion arranged in the processing chamber and electrically isolated from the vacuum chamber; an vacuum exhaust portion configured to exhaust a gas from the processing chamber vacuum; a gas supply portion configured to supply a gas which is used for plasma generation into the processing chamber; a high frequency power supply portion configured to generate plasma discharge in the processing chamber when a high frequency voltage is impressed onto the electrode portion; a matching device configured to match an impedance of a plasma discharge circuit configured to generate the plasma discharge with an impedance of the high frequency power supply portion; and a discharge detection sensor comprising, at least, a plate-shaped dielectric member attached to the vacuum chamber such that one surface thereof opposes plasma discharge generated in the processing chamber, and a probe electrode arranged on the other surface of the dielectric member, wherein said plasma processing device monitors the state of the plasma discharge in the processing chamber, said method comprising:

a signal recording step of receiving a signal of a potential change induced in the probe electrode in response to a change in the plasma discharge, and temporarily storing the signal as signal data indicating the potential change, and a signal analysis step of executing analysis processing for monitoring a state of the plasma discharge with reference to the temporarily stored signal data, wherein the signal analysis step comprises:

determining, by a first detector, a signal of a potential change induced by first arc discharge generated between the electrode portion and an object to be processed;

determining, by a second detector, a signal of a potential change induced by second arc discharge other than the first arc discharge;

obtaining a difference between a number of determinations by the first detector and a number of determinations by the second detector within predetermined time;

comparing the difference and a threshold value; and determining that there is a possibility of generation of abnormal discharge if the difference exceeds the threshold value, wherein a first threshold value for determining the signal of the potential change induced by the first arc discharge is set in the first detector, wherein a second threshold value for determining the signal of the potential change induced by the second arc discharge is set in the second detector such that an absolute value of the second threshold value is larger than an absolute value of the first threshold value, and wherein a positive or negative sign of the first threshold value is opposite to that of the second threshold value.

* * * * *